(12) United States Patent
Pontarollo et al.

(10) Patent No.: US 8,564,096 B2
(45) Date of Patent: Oct. 22, 2013

(54) DIFFUSED INTEGRATED RESISTOR

(75) Inventors: Serge Pontarollo, Saint Egreve (FR); Dominique Berger, Voreppe (FR)

(73) Assignee: STMicroelectronics SA, Montrouge (FR)

(*) Notice: Subject to any disclaimer, the term of this patent is extended or adjusted under 35 U.S.C. 154(b) by 293 days.

(21) Appl. No.: 12/667,863

(22) PCT Filed: Jul. 4, 2008

(86) PCT No.: PCT/EP2008/058660
§ 371 (c)(1),
(2), (4) Date: May 5, 2010

(87) PCT Pub. No.: WO2009/007314
PCT Pub. Date: Jan. 15, 2009

(65) Prior Publication Data
US 2010/0253423 A1 Oct. 7, 2010

(30) Foreign Application Priority Data
Jul. 6, 2007 (FR) ...................... 07 56321

(51) Int. Cl.
*H01L 29/00* (2006.01)
(52) U.S. Cl.
USPC ........... 257/537; 438/382; 438/331; 438/332; 257/467; 257/355; 257/296; 257/536; 257/511; 361/56; 361/103; 327/538; 327/513
(58) Field of Classification Search
USPC .............. 257/467, 355, 296, 511, 536–537; 438/82, 331–332; 361/56, 103; 327/538, 513
See application file for complete search history.

(56) References Cited

U.S. PATENT DOCUMENTS

| | | | | |
|---|---|---|---|---|
| 3,309,537 A | * | 3/1967 | Archer | 377/115 |
| 3,531,733 A | * | 9/1970 | Haines, Jr. | 330/256 |
| 3,725,881 A | * | 4/1973 | Dellor | 365/179 |
| 3,816,762 A | * | 6/1974 | Holt, Jr. | 327/313 |
| 3,898,482 A | * | 8/1975 | Holt, Jr. | 327/310 |
| 3,946,423 A | * | 3/1976 | Augustine | 257/458 |
| 4,075,609 A | * | 2/1978 | Millhollan et al. | 365/154 |
| 4,131,908 A | * | 12/1978 | Daub et al. | 257/370 |
| 4,295,088 A | * | 10/1981 | Malchow | 323/313 |
| 4,578,695 A | * | 3/1986 | Delaporte et al. | 257/296 |

(Continued)

FOREIGN PATENT DOCUMENTS

| | | |
|---|---|---|
| EP | 0066041 A1 | 12/1982 |
| JP | 01 054753 A | 3/1989 |
| JP | 06 163825 A | 6/1994 |
| JP | 11 103019 A | 4/1999 |

*Primary Examiner* — Fernando L Toledo
*Assistant Examiner* — Mohammed Shamsuzzaman
(74) *Attorney, Agent, or Firm* — The Noblitt Group, PLLC

(57) ABSTRACT

Methods and apparatus according to various aspects of the present invention may operate in conjunction with a resistor formed of a lightly-doped P-type region formed in a portion of a lightly-doped N-type semiconductor well extending on a lightly-doped P-type semiconductor substrate, the well being laterally delimited by a P-type wall extending down to the substrate, the portion of the well being delimited, vertically, by a heavily-doped N-type area at the limit between the well and the substrate and, horizontally, by a heavily-doped N-type wall. A diode may be placed between a terminal of the resistor and the heavily-doped N-type wall, the cathode of the diode being connected to said terminal.

4 Claims, 3 Drawing Sheets

(56) References Cited

U.S. PATENT DOCUMENTS

| | | | |
|---|---|---|---|
| 4,590,456 A * | 5/1986 | Burton et al. | 341/133 |
| 4,672,237 A * | 6/1987 | Kiyozuka | 326/126 |
| 4,908,527 A * | 3/1990 | Van Antwerp | 327/511 |
| 4,996,512 A | 2/1991 | Byrkett et al. | |
| 5,359,211 A * | 10/1994 | Croft | 257/173 |
| 5,422,299 A * | 6/1995 | Neudeck et al. | 438/360 |
| 5,598,189 A * | 1/1997 | Hess et al. | 347/9 |
| 5,659,264 A * | 8/1997 | Ariyoshi et al. | 327/513 |
| 5,661,332 A * | 8/1997 | Nakamura et al. | 257/536 |
| 5,670,799 A * | 9/1997 | Croft | 257/173 |
| 5,677,558 A * | 10/1997 | McGlinchey | 257/370 |
| 5,801,418 A * | 9/1998 | Ranjan | 257/336 |
| 5,892,264 A * | 4/1999 | Davis et al. | 257/511 |
| 5,895,958 A * | 4/1999 | Miki | 257/355 |
| 6,018,272 A | 1/2000 | Marsh et al. | |
| 6,043,687 A * | 3/2000 | Callahan, Jr. | 327/73 |
| 6,150,871 A * | 11/2000 | Yee | 327/538 |
| 6,175,226 B1 * | 1/2001 | Clerici et al. | 323/313 |
| 6,303,964 B1 * | 10/2001 | Pulvirenti et al. | 257/355 |
| 6,511,889 B2 * | 1/2003 | Takiguchi | 438/331 |
| 6,940,319 B2 * | 9/2005 | Dulau et al. | 327/108 |
| 7,659,706 B2 * | 2/2010 | Nishida | 323/314 |
| 2001/0040254 A1 * | 11/2001 | Takiguchi | 257/341 |
| 2002/0039313 A1 * | 4/2002 | Kuriyama | 365/200 |
| 2003/0038332 A1 * | 2/2003 | Kimura | 257/467 |
| 2003/0207544 A1 * | 11/2003 | Shimamoto et al. | 438/382 |
| 2004/0257112 A1 * | 12/2004 | Hidaka et al. | 326/82 |
| 2005/0101097 A1 * | 5/2005 | Shimamoto et al. | 438/332 |
| 2006/0001599 A1 * | 1/2006 | Onozawa et al. | 345/60 |
| 2007/0080905 A1 * | 4/2007 | Takahara | 345/76 |
| 2007/0263334 A1 * | 11/2007 | Nishida | 361/103 |
| 2008/0278213 A1 * | 11/2008 | Morini | 327/344 |
| 2009/0273870 A1 * | 11/2009 | Ishizuka et al. | 361/56 |
| 2010/0109752 A1 * | 5/2010 | Yamamoto | 327/512 |

* cited by examiner

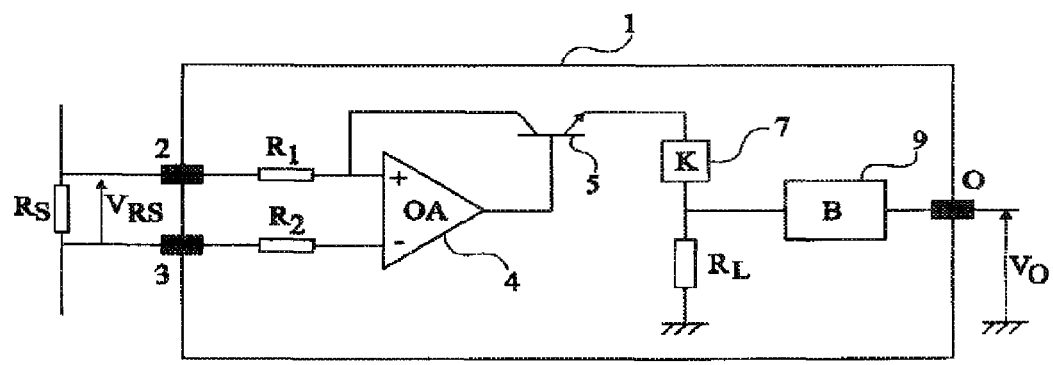
(Prior Art) Fig 1
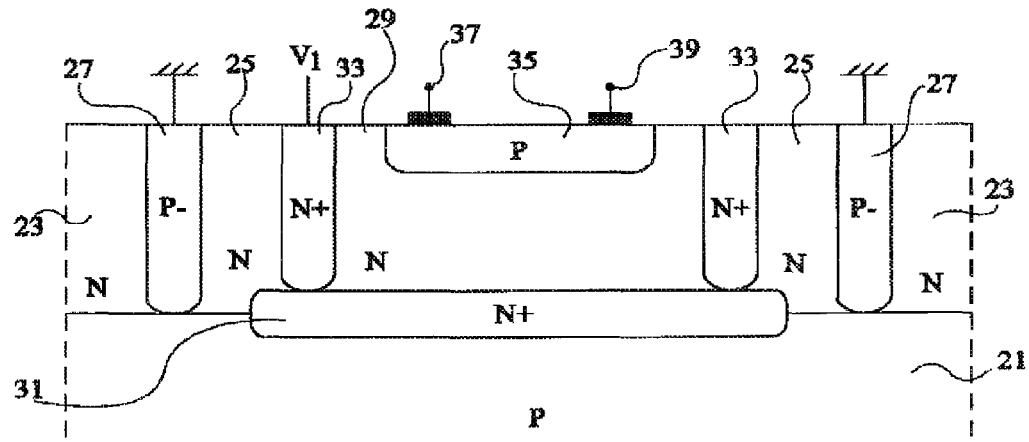
(Prior Art) Fig 2
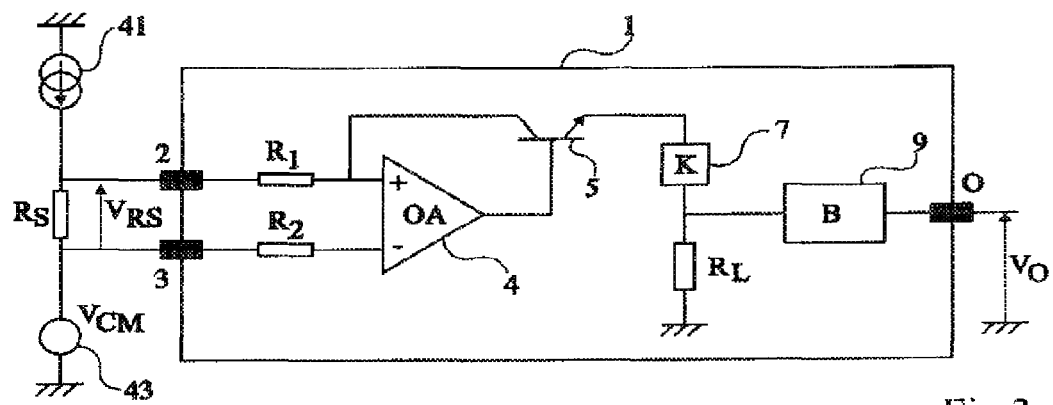
(Prior Art) Fig 3

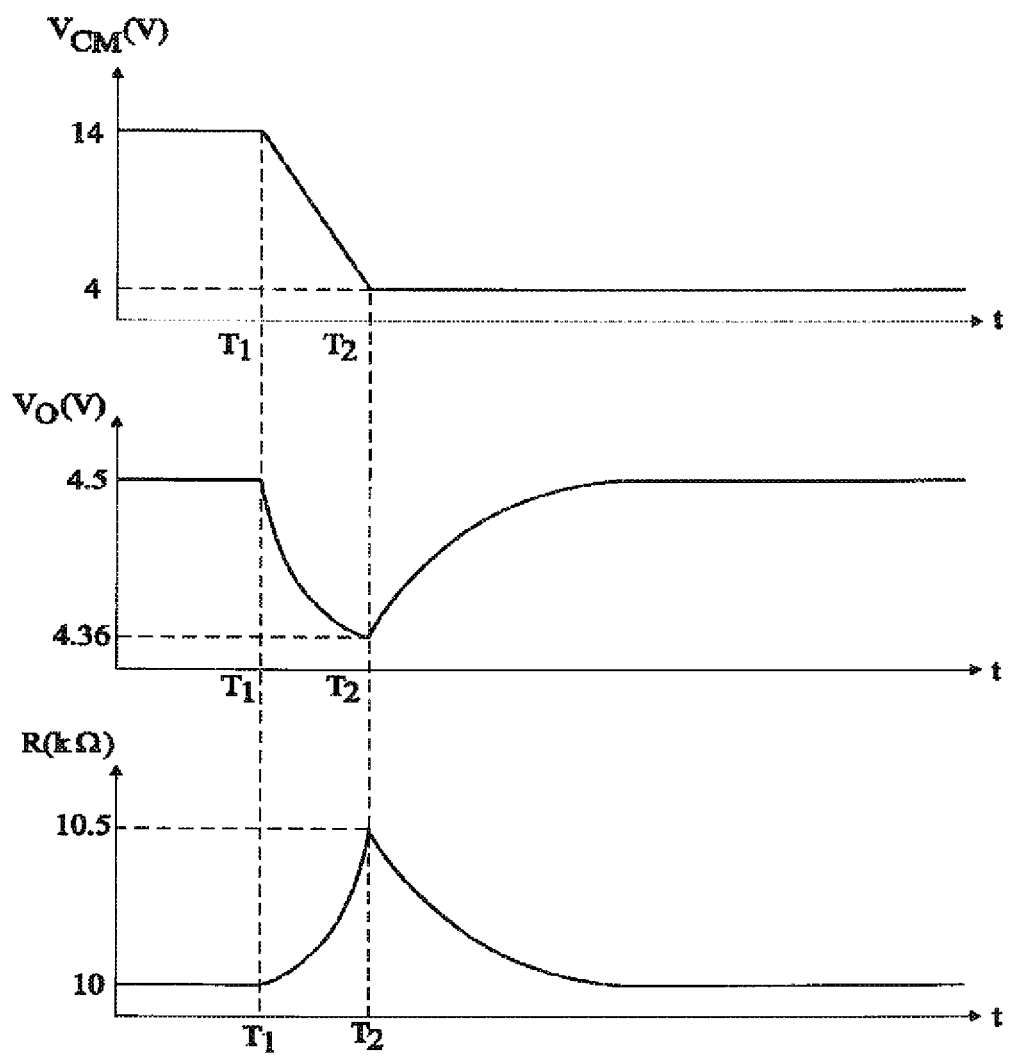
(Prior Art) Fig 4

DIFFUSED INTEGRATED RESISTOR

BACKGROUND OF THE INVENTION

1. Field of the Invention

The present invention relates to a semiconductor structure and more particularly to a structure comprising diffused integrated resistors and to an application of such structure to an amplification circuit.

2. Discussion of the Related Art

FIG. 1 illustrates an electronic amplification circuit 1, currently called "current sense amplifier", enabling measuring the current flowing through a line. Amplification circuit 1 comprises two inputs 2 and 3 and one output O. First input 2 is connected to the first terminal of a resistor $R_1$. The second terminal of resistor $R_1$ is connected to the positive input of an operational amplifier (OA) 4. Second input 3 is connected to the first terminal of a resistor $R_2$. The second terminal of resistor $R_2$ is connected to the negative terminal of operational amplifier 4. The positive input of operational amplifier 4 is also connected to the collector of an NPN transistor 5 having its base connected to the output of operational amplifier 4. The emitter of transistor 5 is connected to an element 7 of amplification of gain K, and the second terminal of element 7 is grounded via a resistor $R_L$ and is connected to output O of amplification circuit 1 via an amplifier with a high input impedance (B) 9. The differential input voltage of amplification circuit 1, taken between input terminals 2 and 3, is called $V_{RS}$, and the output voltage of the amplification circuit, taken from output O, is called $V_O$. The average voltage of input terminals 2 and 3 with respect to ground is called the common-mode voltage, $V_{CM}$. A resistor $R_S$ is placed outside of amplification circuit 1, between input terminals 2 and 3. Resistor $R_S$ is placed on a line (not shown), the current of which is desired to be measured.

In known fashion, in the case where resistors $R_1$ and $R_2$ are equal, amplification circuit 1 illustrated in FIG. 1 has a gain G equal to:

$$G = \frac{V_O}{V_{RS}} = K\frac{R_L}{R_1}$$

The values of resistances $R_1$, $R_2$, and $R_L$ and of the ratios between these resistances must thus be very accurate since they set the gain of amplification circuit 1.

The case where resistors $R_1$, $R_2$, and $R_L$ are diffused integrated resistors is here considered. Such resistors have the advantage of being able to be formed at low cost and of having a relatively accurate value.

FIG. 2 illustrates a conventional embodiment of a diffused resistor. A lightly-doped N-type semiconductor layer 23 is formed on a lightly-doped P-type semiconductor substrate 21. In layer 23, an N-type well 25 is delimited by a P-type wall 27 which extends down to substrate 21 and which is connected to a reference voltage, for example, to ground, to isolate well 25 from the other components formed in and on semiconductor layer 23. A portion 29 of well 25, in which the resistor is formed, is delimited, vertically, by a heavily-doped N-type buried layer 31, at the limit between layer 23 and substrate 21 and, horizontally, by a heavily-doped N-type wall 33 joining buried area 31. In the upper portion of well 25, 29, a P-type doped region 35 forms the resistor. This region 35 is, for example, a rectilinear region having its length-to-width ratio setting the desired resistance value. Two connection terminals 37 and 39 are taken at two locations of region 35.

In the case where this resistor is used as resistor $R_1$ of the amplification circuit of FIG. 1, terminal 37 is connected to input 2 of amplification circuit 1 and terminal 39 is connected to the internal components of circuit 1.

There are two conventional ways of biasing well 25, 29. The first one comprises biasing well 25, 29 to a voltage $V_1$ (as shown in FIG. 2) and the second one comprises letting well 25, 29 float.

In the first case, a voltage $V_1$ is applied on wall 33 and thus on buried area 31, which uniformly biases well 25, 29. Voltage $V_1$ must be greater than the maximum voltage applied to the resistor to avoid for the PN junction, between P-type region 35 and N-type well 25, 29, to be forward biased.

However, the biasing of the well to a voltage $V_1$ raises two problems, in particular when the resistor is used in an amplification circuit such as that of FIG. 1, in which the common-mode voltage is likely to vary strongly. The first problem is of course that PN junction 35-29 risks being forward biased. The second problem is that the extension of the space charge area in P-type region 35 depends on the voltage difference between voltage $V_1$ and the common-mode voltage. A variation in the common-mode voltage thus causes a variation in the value of the resistance between terminals 37 and 39. In the expression of gain G of the amplification circuit of FIG. 1, it should be noted that a simultaneous variation in the values of resistors $R_1$ and $R_2$ has no influence upon the gain, and thus causes no problem. However, a variation in the value of resistance $R_1$ modifies the gain value since the value of resistance $R_L$ remains constant. Indeed, resistance $R_L$ is not submitted to the voltage variations at the input of the amplification circuit. A variation in gain G is generally not desired.

In the second case, well 25, 29 is left floating. Thereby, the voltage of floating well 25, 29 is equal to the highest voltage in region 35, minus approximately 0.6 V corresponding to the forward voltage drop of a PN junction. The extension of the space charge area in P region 35 is then very small and substantially constant.

In an alternative to the second case, well 25, 29 could be biased to the highest voltage of the resistor by connecting wall 33 to terminal 37. However, if the voltage applied at input 2 of the circuit, and then at terminal 37 of the resistor, becomes negative, as is often the case in automotive applications, the PN junction formed by the P-type wall 27 connected to ground and the N-type well 25, 29 can become forward biased. This increases the risk of parasitic transistors or thyristors being formed.

The second case (floating well 25, 29) appears to be the most interesting. It has thus been attempted to form diffused resistors placed in floating wells. Structures of amplification circuits measuring a current comprising such resistors have been tested by the present inventors, and the latter have found that, for a constant current in resistor $R_S$ and thus a constant value of $V_{RS}$, output voltage $V_O$ of the amplification circuit varies when the average voltage on the resistor varies. In other words, the amplification circuit gain varies when the input terminals are submitted to voltage fluctuations.

SUMMARY OF THE INVENTION

The present invention may provide a diffused resistor with a value which does not vary along with the average voltage which is applied thereto.

Thus, an embodiment of the present invention provides a semiconductor structure comprising a resistor formed of a lightly-doped P-type region formed in a portion of a lightly-doped N-type semiconductor well, the well extending on a lightly-doped P-type semiconductor substrate, the well being laterally delimited by a P-type wall extending down to the substrate, the portion of the well being delimited, vertically, by a heavily-doped N-type area at the limit between the well and the substrate and, horizontally, by a heavily-doped N-type wall, characterized in that a diode is placed between a terminal of the resistor and the heavily-doped N-type wall, the cathode of the diode being connected to said terminal.

According to an embodiment of the present invention, the semiconductor structure comprises a protection diode located between said terminal of the resistor and ground, the cathode of said protection diode being coupled to said terminal.

According to an embodiment of the present invention, the region is a rectilinear region.

According to an embodiment of the present invention, the diode is formed by means of a bipolar transistor having its base connected to the collector.

An embodiment of the present invention provides an amplification circuit enabling measuring the current in a line, comprising two inputs and one output, the first input being connected to the first terminal of a first resistor having its second terminal connected to the positive input of an operational amplifier, the second input being connected to the first terminal of a second resistor having its second terminal connected to the negative input of the operational amplifier, the gain of the circuit depending on the ratio between one of the first and second resistors and a third resistor internal to the circuit, the first and second resistors being of the above type.

The foregoing and other objects, features, and advantages of the present invention will be discussed in detail in the following non-limiting description of specific embodiments in connection with the accompanying drawings.

BRIEF DESCRIPTION OF THE DRAWINGS

FIG. 1, previously described, illustrates an amplification circuit enabling measuring a current in a line;

FIG. 2, previously described, illustrates a diffused resistor formed in a well of an integrated circuit;

FIG. 3 illustrates an amplification circuit identical to that of FIG. 1 enabling testing the gain of the amplification circuit according to a variation of the voltage simultaneously applied on the circuit inputs;

FIG. 4 illustrates time curves relating to the circuit of FIG. 3;

DETAILED DESCRIPTION

Figure 5:
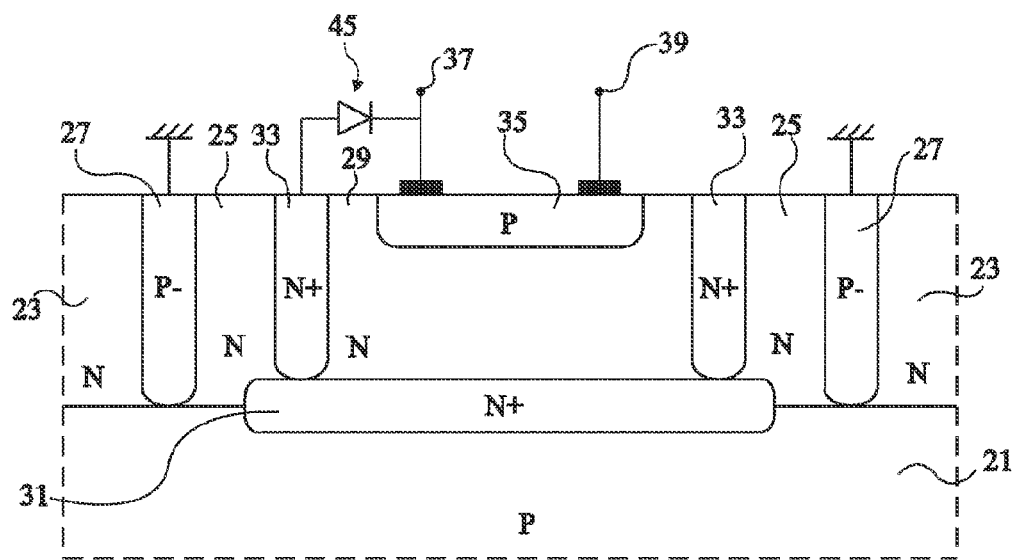
FIG. 5 illustrates a resistor in a floating well according to an embodiment of the present invention.

For clarity, the same elements have been designated with the same reference numerals in the different drawings and, further, as usual in the representation of integrated circuits, the drawings show cross-section views of integrated circuit portions and are not to scale.

FIG. 3 shows an amplification circuit 1 identical to that of FIG. 1, in which resistor $R_1$ is a resistor of the type in FIG. 2 having its well 25, 29 left floating. A resistor $R_S$ is placed between inputs terminals 2 and 3. Voltage $V_{RS}$ across resistor $R_S$ is maintained at a constant value by a constant current source 41 placed in series with resistor $R_S$. As an example, voltage $V_{RS}$ may be maintained at a value equal to 50 mV. A voltage source 43, delivering a square pulse voltage $V_{CM}$, is placed between terminal 3 and the ground. This voltage source enables simultaneously varying the voltages applied on terminals 2 and 3 since the current flowing through resistor $R_S$ is constant. In other words, this voltage source provides a variable common-mode voltage $V_{CM}$ to the amplifier input. As an example, voltage source 43 may provide square pulses having an amplitude equal to 10 V.

FIG. 4 shows three time curves relating to the circuit of FIG. 3. The first curve shows voltage $V_{CM}$ provided by voltage source 43, the second, curve shows voltage $V_O$ on output O of amplification circuit 1, and the third curve illustrates the value of resistance $R_1$. These curves illustrate the case where voltage $V_{CM}$ decreases rapidly, between a time $T_1$ and a time $T_2$, from 14 V to 4 V. Theoretically, between times $T_1$ and $T_2$, voltage $V_O$ at the output of amplification circuit 1 should be constant, since voltage $V_{RS}$ between input terminals 2 and 3 does not vary. However, in FIG. 4, it should be noted that voltage $V_O$ substantially decreases and varies, between times $T_1$ and $T_2$, from 4.5 V to 4.36 V, then slowly returns, after time $T_2$, to a voltage equal to 4.5 V. This means that gain G of the amplification circuit varies since input voltage $V_{RS}$ is constant. The present inventors have searched the cause of this anomaly and have found that it had to be imputed to the fact that, conversely to a common prejudice, resistor $R_1$ has a value which varies when the common-mode voltage abruptly decreases. As illustrated in the third curve of FIG. 4, the value of resistance $R_1$ varies inversely to the variation of output voltage $V_O$. The value of $R_1$ varies from 10 kΩ to 10.5 kΩ when $V_{CM}$ decreases, between $T_1$ and $T_2$, then slowly returns to a value of 10 kΩ after time $T_2$. The variation of voltage $V_O$ at the output of the amplification circuit is thus linked to a variation in the value of resistance $R_1$.

This can be explained by the fact that, when $V_{CM}$ decreases, the voltage on the input terminal of resistor $R_1$ decreases and the voltage in region 35 becomes smaller than that of well 25, 29. The PN junction between region 35 and well 25, 29 then is in reverse. Now, the reverse leakage current of the PN junction is small, whereby the return to equilibrium of the voltage on either side of the junction takes some time. During this time of return to equilibrium, the variation of the voltage difference between region 35 and well 25, 29 modifies the extension of the space charge area at the junction between region 35 and well 25, 29. The volume through which the carriers pass in region 35 decreases, which increases the value of resistor $R_1$. It should be noted that this problem is not posed in the case where $V_{CM}$ increases since the connection between region 35 and well 25, 29 is then forward. The return to equilibrium thus occurs, in this direction, more rapidly.

FIG. 5 illustrates a resistor in a floating well according to an embodiment of the present invention. The general structure of this resistor is the same as that of FIG. 2, well 25, 29 being left floating. It will not be described in detail again.

To accelerate the return to equilibrium of well 25, 29, an embodiment of the present invention provides placing, between terminal 37 and heavily-doped N-type wall 33, a diode 45 having its cathode connected to terminal 37 and having its anode connected to heavily-doped N-type wall 33. Diode 45 is thus placed in parallel with the PN junction formed between region 35 and well 25, 29, in the reverse direction with respect to this junction.

When the average voltage in region 35 strongly decreases, the voltage in well 25, 29 becomes greater than the voltage in region 35. Diode 45 is then conductive, and enables fast return to equilibrium. Indeed, the forward current in diode 45 is much greater than the reverse leakage current in the PN junction between region 35 and well 25, 29. The resistance value thus varies little during the decrease of the average voltage of region 35. In the case where the average voltage of region 35 increases, diode 45 is blocked and the return to equilibrium is performed via the PN junction between region 35 and well 25, 29.

Moreover, when the resistor 35 is placed at an input of a circuit such as resistor R1 or R2 in the circuit of FIG. 3, diode 45 will provide the advantage of preventing parasitic transistors or thyristors being formed in the case that the voltage on terminal 37 becomes negative. Indeed, especially in circuits adapted for automotive applications, a protection diode against polarity change is placed between each input terminal and ground, the anode of these protection diodes being coupled to ground. When the input voltage becomes negative, the associated protection diode becomes forward biased and enables the negative voltage to flow towards ground.

More particularly, in a practical embodiment of the circuit of FIG. 5, a protection diode (not shown) is placed between terminal 37 and ground. Thus, terminal 37 is coupled to ground by the serial association of diode 45 and of the PN junction formed by P-type wall 27 and N-type well 25, 29, but also by the protection diode. When the voltage on terminal 37 is negative, this voltage flows by the path having the smallest voltage drop, i.e. via the protection diode. Thus, the PN junction formed by P-type wall 27 and N-type well 25, 29 remains reverse biased, avoiding parasitic transistors or thyristors being formed, such a formation appearing when the PN junction is in parallel with the protection diode and where it can become forward biased.

Figure 6:
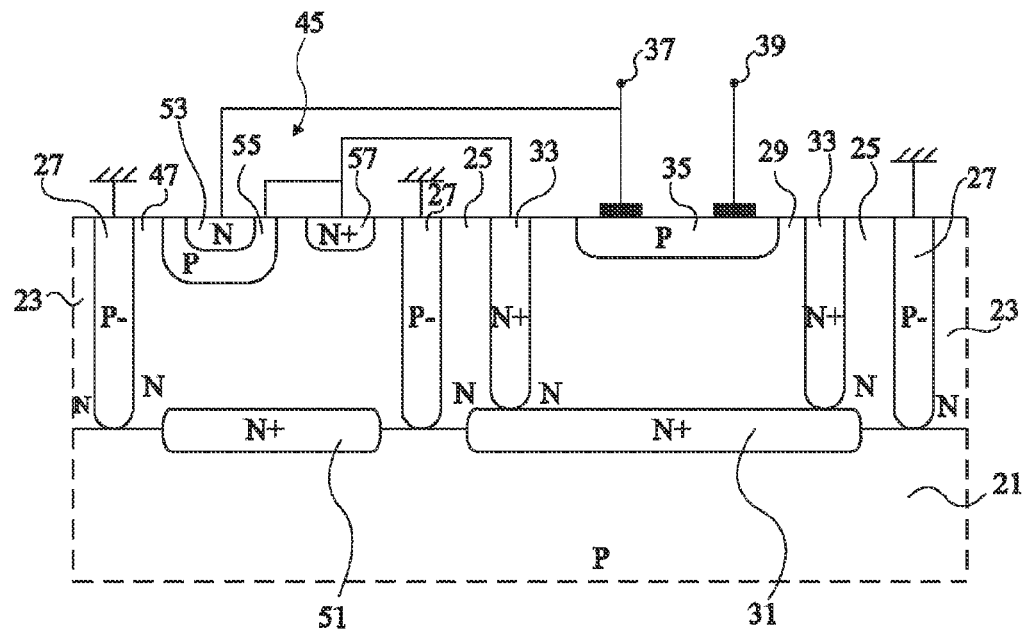
FIG. 6 illustrates a specific embodiment of the resistor of the present invention.

FIG. 6 illustrates a specific embodiment of the present invention. FIG. 6 comprises, in its right-hand half, a resistor identical to that of FIG. 2, having its well left floating. In the left-hand portion of FIG. 6 is formed a diode 45. Diode 45 is formed in a well 47 formed in semiconductor layer 23 and isolated by a P-type wall 27 identical to that which surrounds well 25. At the limit between well 47 and P-type doped substrate 21, a heavily-doped N-type buried area 51, identical to buried area 31, is formed. In well 47, to form diode 45, a transistor having its base and its collector connected together is formed. Thus, in the upper portion of well 47 is formed an N-type area 53 forming the transistor emitter, surrounded with a P-type area 55 forming the transistor base. A heavily-doped N-type area 57 is formed in N-type well 47 and forms the collector contact of the transistor. To obtain the desired diode 45, N-type emitter 53 is connected to terminal 37, and P-type base 55 is connected to the collector by heavily-doped N-type area 57 and to heavily-doped N-type wall 33. A diode according to an embodiment of the present invention is thus obtained, having its cathode connected to terminal 37 and having its anode connected to wall 33.

It should be noted that the example shown in FIG. 6 is not limiting and that any type of diode connected in the way illustrated in FIG. 5 would be appropriate.

Of course, the present invention is likely to have various alterations, modifications, and improvements which will readily occur to those skilled in the art. Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. An amplification circuit enabling measuring the current in a line, comprising two inputs and one output, the first input being connected to the first terminal of a first resistor having its second terminal connected to the positive input of an operational amplifier, the second input being connected to the first terminal of a second resistor having its second terminal connected to the negative input of the operational amplifier, the gain of the circuit depending on the ratio between one of the first and second resistors and a third resistor internal to the circuit, wherein each of the first and second resistors comprises a semiconductor structure comprising:
a diffused resistor structure comprising a lightly-doped P-type region formed in a portion of a lightly-doped N-type semiconductor well, the well extending on a lightly-doped P-type semiconductor substrate, the well being laterally delimited by a P-type wall extending down to the substrate, the portion of the well being delimited, vertically, by a heavily-doped N-type area at the limit between the well and the substrate and, horizontally, by a heavily-doped N-type wall; and
a diode placed between a terminal of the diffused resistor structure and the heavily-doped N-type wall, the cathode of the diode being connected to the terminal of the diffused resistor structure and the anode of the diode being connected to the heavily-doped N-type wall, wherein the terminal of the diffused resistor structure is positioned at a location of the lightly-doped P-type region, and wherein the diode comprises a bipolar transistor having a base connected to a collector.

2. The amplification circuit of claim 1, further comprising a protection diode located between the terminal of the diffused resistor structure and ground, the cathode of the protection diode being coupled to the terminal of the diffused resistor structure.

3. The amplification circuit of claim 1, wherein the lightly-doped P-type region is a rectilinear region.

4. The amplification circuit of claim 1, wherein:
the diode comprises:
a P-type area formed in a second N-type semiconductor well;
a second N-type area formed in the P-type area; and
a third heavily-doped N-type area formed in the second N-type semiconductor well, wherein the third heavily-doped N-type area is connected to the P-type area;
the second N-type area is connected to the terminal of the diffused resistor structure; and
the third heavily-dope N-type area and the P-type area are connected to the heavily-doped N-type wall.

* * * * *